(12) United States Patent
Lee et al.

(10) Patent No.: US 12,189,304 B2
(45) Date of Patent: Jan. 7, 2025

(54) METHOD AND STRUCTURES FOR ACOUSTIC WAVE OVERLAY ERROR DETERMINATION

(71) Applicant: Taiwan Semiconductor Manufacturing Co., Ltd., Hsinchu (TW)

(72) Inventors: Yu-Ching Lee, Kaohsiung (TW); Yu-Piao Fang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 925 days.

(21) Appl. No.: 17/215,676

(22) Filed: Mar. 29, 2021

(65) Prior Publication Data

US 2021/0216022 A1 Jul. 15, 2021

Related U.S. Application Data

(62) Division of application No. 15/962,518, filed on Apr. 25, 2018, now Pat. No. 10,962,888.

(60) Provisional application No. 62/592,241, filed on Nov. 29, 2017.

(51) Int. Cl.
  *G03F 7/20* (2006.01)
  *G03F 7/00* (2006.01)
  *G06T 7/00* (2017.01)
  *G06T 7/68* (2017.01)

(52) U.S. Cl.
  CPC ...... *G03F 7/70633* (2013.01); *G03F 7/70641* (2013.01); *G06T 7/001* (2013.01); *G06T 7/68* (2017.01); *G06T 2207/30148* (2013.01)

(58) Field of Classification Search
  None
  See application file for complete search history.

(56) References Cited

U.S. PATENT DOCUMENTS

| | | |
|---|---|---|
| 6,323,097 B1 | 11/2001 | Wu et al. |
| 8,796,666 B1 | 8/2014 | Huang et al. |
| 8,837,810 B2 | 9/2014 | Chen et al. |

(Continued)

FOREIGN PATENT DOCUMENTS

| | | |
|---|---|---|
| CN | 1421898 A | 6/2003 |
| CN | 101278237 A | 10/2008 |

(Continued)

*Primary Examiner* — Jack S Chen
(74) *Attorney, Agent, or Firm* — HAYNES AND BOONE, LLP

(57) ABSTRACT

A method includes forming a first material layer on a semiconductor wafer, the first material layer comprising a first periodic structure within an overlay mark region of the semiconductor wafer and forming a second material layer on the semiconductor wafer, the second material layer comprising a second periodic structure in the overlay mark region. The method further includes with an acoustic transmitter device disposed within the overlay mark region, transmitting an acoustic wave across both the first periodic structure and the second periodic structure. The method further includes, with an acoustic wave receiver device, detecting the acoustic wave and determining an overlay error between the first material layer and the second material layer based on the acoustic wave as detected by the acoustic wave receiver device.

20 Claims, 11 Drawing Sheets

(56) References Cited

U.S. PATENT DOCUMENTS

| | | |
|---|---|---|
| 9,093,530 B2 | 4/2015 | Huang et al. |
| 9,134,633 B2 | 9/2015 | Lin et al. |
| 9,230,867 B2 | 1/2016 | Cheng et al. |
| 9,304,403 B2 | 4/2016 | Lin et al. |
| 9,404,743 B2 | 8/2016 | Chiu et al. |
| 9,548,303 B2 | 1/2017 | Lee et al. |
| 9,823,585 B2 | 11/2017 | Shih et al. |
| 9,841,687 B2 | 12/2017 | Lee et al. |
| 10,962,888 B2 * | 3/2021 | Lee .................... G03F 7/70641 |
| 2013/0048979 A1 | 2/2013 | Piper |
| 2013/0121373 A1 | 5/2013 | Skliar et al. |
| 2014/0355388 A1 | 12/2014 | Kent et al. |
| 2016/0258908 A1 | 9/2016 | Goto et al. |
| 2017/0336198 A1 | 11/2017 | Adel et al. |
| 2018/0032211 A1 | 2/2018 | King et al. |
| 2019/0163076 A1 | 5/2019 | Lee et al. |

FOREIGN PATENT DOCUMENTS

| | | |
|---|---|---|
| CN | 102741650 A | 10/2012 |
| CN | 104795383 A | 7/2015 |
| CN | 106463429 A | 2/2017 |
| CN | 106463430 A | 2/2017 |
| TW | 444313 B | 7/2001 |
| TW | 201626110 A | 7/2016 |
| TW | 201734632 A | 10/2017 |

* cited by examiner

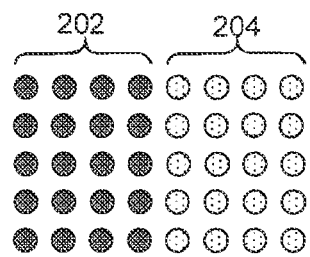
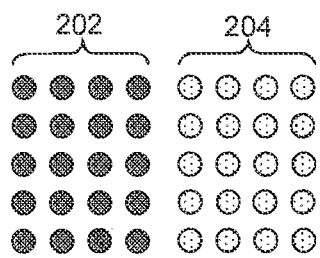
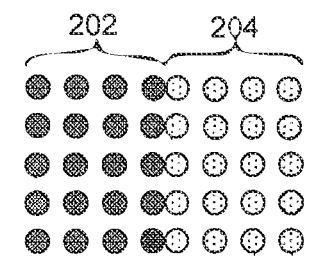
*FIG. 2A*  *FIG. 2B*  *FIG. 2C*
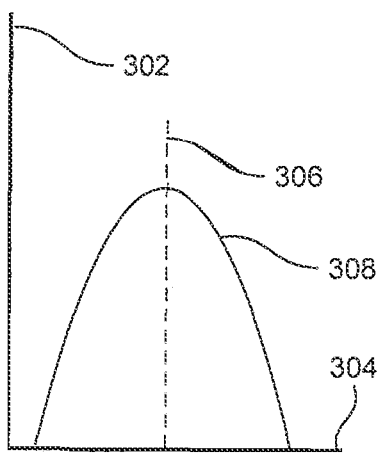
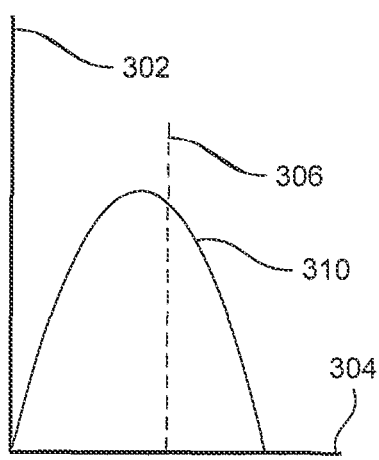
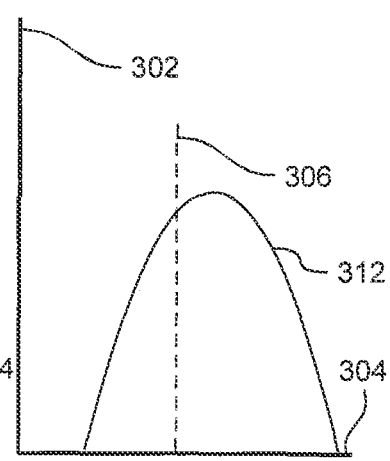
*FIG. 3A*  *FIG. 3B*  *FIG. 3C*

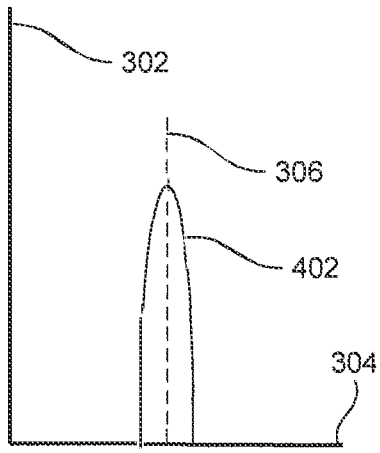 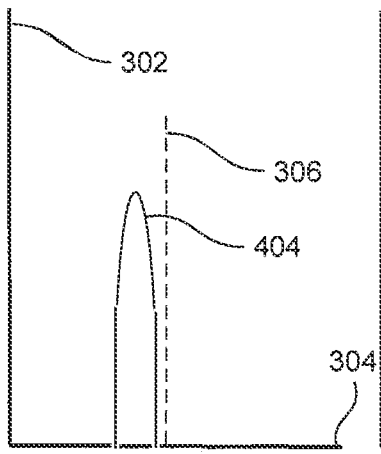 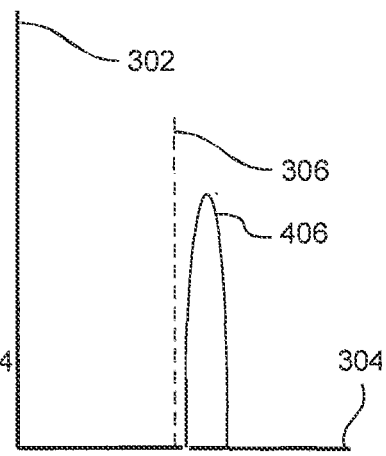
*FIG. 4A*  *FIG. 4B*  *FIG. 4C*
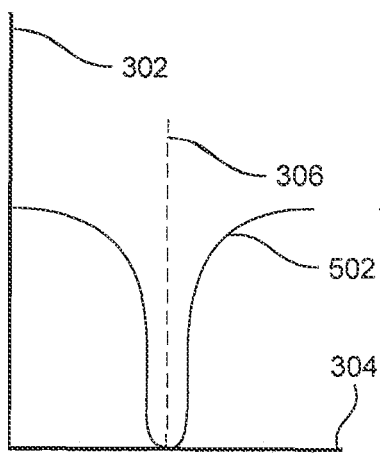 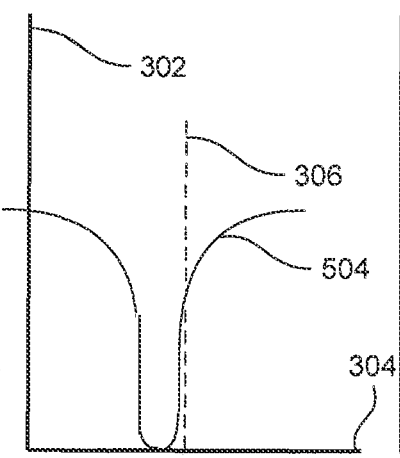 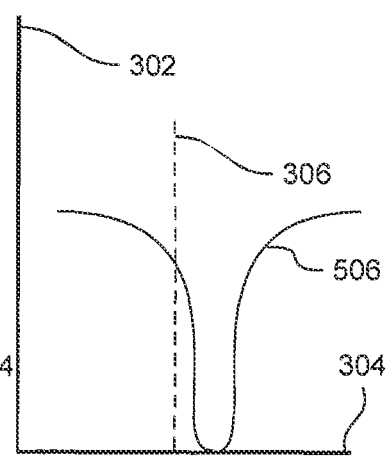
*FIG. 5A*  *FIG. 5B*  *FIG. 5C*

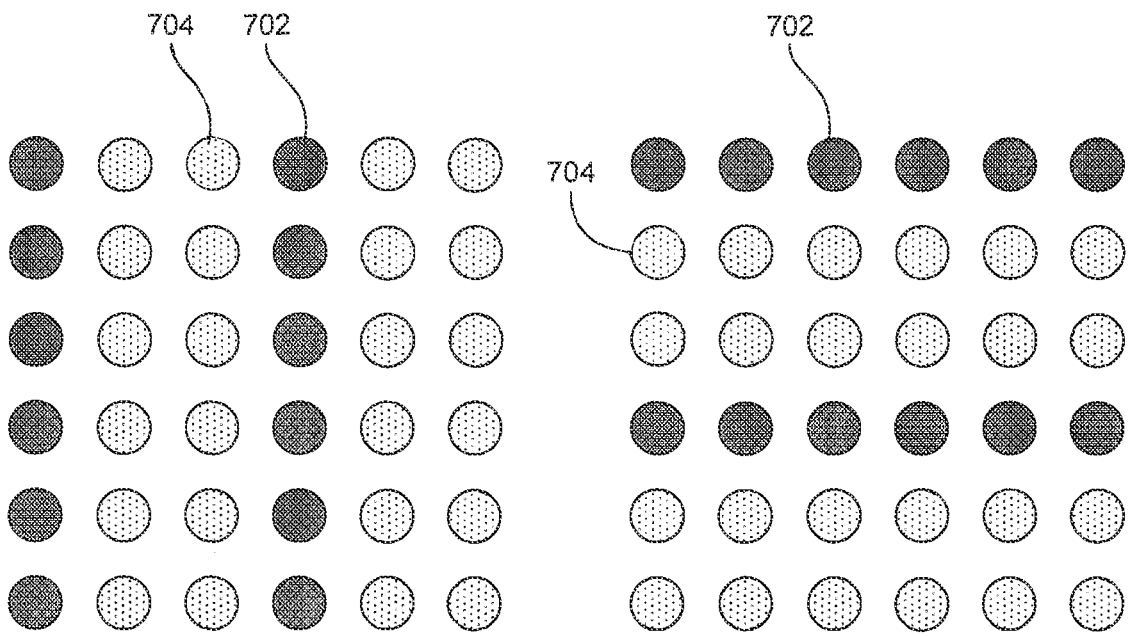
FIG. 7E  FIG. 7F
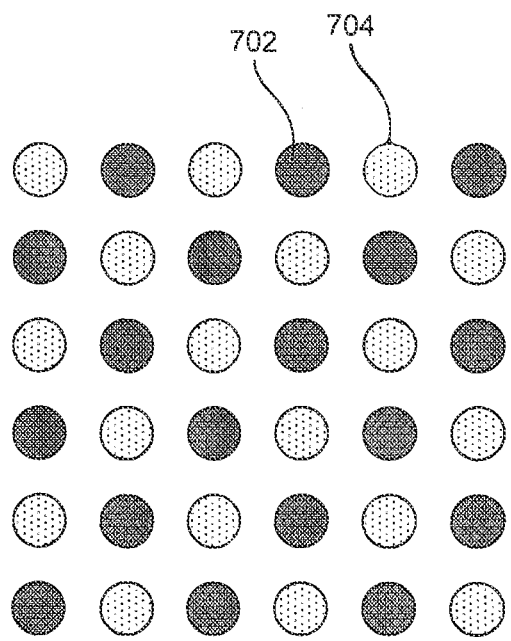
FIG. 7G

METHOD AND STRUCTURES FOR ACOUSTIC WAVE OVERLAY ERROR DETERMINATION

PRIORITY INFORMATION

This application is a divisional of U.S. patent application Ser. No. 15/962,518 filed Apr. 25, 2018 and entitled "Method and Structures for Acoustic Wave Overlay Error Determination," which claims priority to Provisional Patent Application No. 62/592,241 filed Nov. 29, 2017, and entitled "Methods and Structures for Acoustic Wave Overlay Error Determination," the disclosure of which is hereby incorporated by reference in the entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

One challenge to semiconductor fabrication is alignment. Semiconductor fabrication involves forming several patterned layers on top of each other. Each of these layers must be precisely aligned, or else the final device may not function correctly.

Alignment techniques often involve the use of overlay marks. For example, various layers to be patterned on a substrate may include overlay marks that are used to align with other formed layers. Matching overlay marks are formed within patterns of the subsequently formed layers. These matching overlay marks are placed within the patterns of the subsequent layers such that when aligned with the corresponding overlay marks of the underlying layers, both layers are aligned. But, such alignment techniques are not perfect and it is desirable to have alignment techniques that provide improved alignment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, and 2C are diagrams showing a top view of periodic structures used for overlay marks, according to one example of principles described herein.

FIGS. 3A, 3B, and 3C are graphs showing acoustic wave signals corresponding to the placement of the periodic structures of FIGS. 2A, 2B, and 2C, according to one example of principles described herein.

FIGS. 4A, 4B, and 4C are graphs showing reflected acoustic wave signals corresponding to the placement of the periodic structures of FIGS. 2A, 2B, and 2C, according to one example of principles described herein.

FIGS. 5A, 5B, and 5C are graphs showing transmitted acoustic wave signals corresponding to the placement of the periodic structures of FIGS. 2A, 2B, and 2C, according to one example of principles described herein.

FIGS. 7A, 7B, 7C, 7D, 7E, 7F, and 7G are diagrams showing various configurations for overlay marks, according to one example of principles described herein.

DETAILED DESCRIPTION

Figure 1:
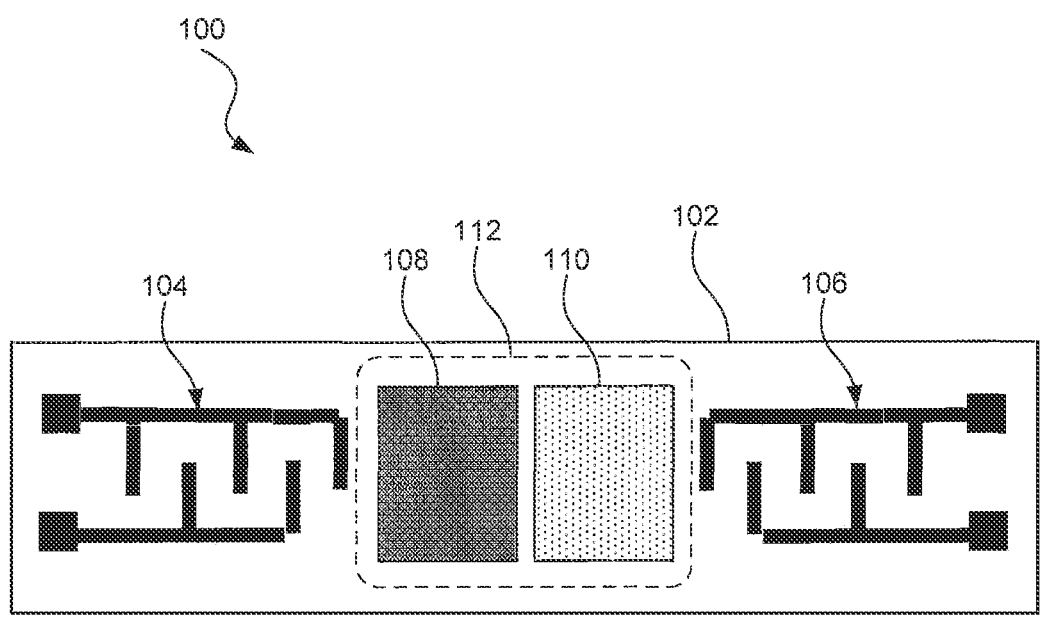
FIG. 1 is a diagram showing an illustrative overlay mark structure, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, alignment techniques often involve the use of overlay marks, which are sometimes referred to as overlay marks. For example, various layers to be patterned on a substrate may include overlay marks that are used to align with other formed layers. Matching overlay marks are formed within patterns of the subsequently formed layers. These matching overlay marks are placed within the patterns of the subsequent layers such that when aligned with the corresponding overlay marks of the underlying layers, both layers are aligned. But, such alignment techniques are not perfect and it is desirable to have alignment techniques that provide improved alignment.

According to principles described herein, overlay marks from two different layers are designed to transmit or reflect acoustic waves. Such overlay marks may be placed in a region of a semiconductor where a transducer is placed. The transducer converts electrical energy to mechanical energy in the form of an acoustic wave. The acoustic wave then passes through a first overlay mark associated with a first layer and a second overlay mark associated with a different layer. The acoustic wave, as either reflected off the overlay marks or transmitted through the overlay marks, may then be detected by an acoustic wave receiver device. The nature of the detected wave will change based on the alignment between the first overlay mark in the second overlay mark. Thus, by analyzing the detected acoustic wave, and alignment error may be determined.

FIG. 1 is a diagram showing an illustrative overlay mark structure 100. The overlay mark structure 100 is positioned within a particular region 102 within a semiconductor chip. The overlay mark structure 100 may be positioned within one or more layers of a semiconductor wafer. For example, the overlay mark structure 100 may be positioned on the semiconductor substrate or any subsequently formed layer such as a metal layer or dielectric layer. According to the present example, the overlay mark structure 100 includes an acoustic wave transmitter device 104, and acoustic wave receiver device 106, the periodic structure region 112 having a first periodic structure 108 and a second periodic structure 110.

The semiconductor wafer in which the overlay mark is positioned may be a circular wafer used to fabricate integrated circuits. In some examples, the overlay mark structure 100 may be positioned within the scribe lines of the semiconductor wafer. The scribe lines are the lines on which the semiconductor wafer is cut after fabrication. In some examples, however, the overlay mark structure 100 may be positioned between scribe lines and thus be part of the final semiconductor chip product.

The acoustic wave transmitter device 104 may be an accusing emitter. In other words, the acoustic wave transmitter device 104 is designed to emit an acoustic wave along the surface of the substrate. In one example, the acoustic wave transmitter device 104 is an interdigital transducer. The acoustic wave transmitter device 104 may be designed to convert electrical signals into mechanical signals. In some examples, the overlay mark structure 100 may be positioned over a piezoelectric layer. A piezoelectric material may experience mechanical strain or stress upon application of an electrical current. Thus, an AC electrical signal applied to the acoustic wave transmitter device 104 may cause surface acoustic wave signal to be transmitted across the periodic structure region 112.

The periodic structure region 112 includes the first periodic structure 108 and the second periodic structure 110. In one example, the first periodic structure 108 is formed along with a first patterned layer formed on the semiconductor wafer. For example, the first patterned layer may be a polysilicon gate layer. Thus, the first periodic structure 108 may thus include polysilicon features. Such features may be formed through photolithographic processes. For example, a polysilicon layer may be deposited. A photoresist material may then be deposited over the polysilicon layer. The photoresist material may then be exposed to a light source through a photomask and then developed. The exposed regions of the polysilicon layer may then be removed through an etching process to create the patterned polysilicon layer. As will be explained in further detail below, the first periodic structure 108 may include a two-dimensional array of features. Such features may be sized and spaced apart so as to create a desired frequency profile for an acoustic wave being transmitted through or reflected off of the periodic structure 108.

The second periodic structure 110 may be similar to the first periodic structure 108. Specifically, the second periodic structure 110 may include a two-dimensional real features being sized and shaped similarly to those of the first periodic structure 110. The second periodic structure may be associated with a second material layer formed on a semiconductor wafer. The second periodic structure 110 is positioned within the overall pattern such that when the pattern of the second material layer is aligned with the pattern of the first material, the second periodic structure 110 is positioned adjacent the first periodic structure 108. The second periodic structure 110 is positioned adjacent the first periodic structure 108 such that when properly aligned, the features from both structures 108, 110 form a single two-dimensional array with similar spacing throughout.

In the present example, the acoustic wave receiver device 106 is positioned opposite the periodic structure region 112 from the acoustic wave transmitter device 104. Thus, the acoustic wave receiver device 106 may be designed to detect acoustic waves as they are transmitted through the first periodic structure 108 and the second periodic structure 110. The acoustic wave receiver device 106 is designed to convert mechanical energy into electrical energy. In other words, the acoustic wave receiver device 106 detects the surface acoustic waves being transmitted through the periodic structures 108, 110, and converts those surface acoustic waves into electrical signal that is representative of the service acoustic waves. Electric signal can be analyzed for characteristics indicative of water the first periodic structure 108 is aligned with the second periodic structure 110.

In some examples, the acoustic wave receiver device 106 may be positioned on the same side of the periodic structure region 112 as the acoustic wave transmitter device 104. In such examples, the acoustic wave receiver device 106 may be configured to detect surface acoustic waves as they are reflected off of the periodic structures 108, 110.

FIGS. 2A, 2B, and 2C are diagrams showing a top view of periodic structures used for overlay marks. According to the present example, FIG. 2A illustrates two overlay marks 202, 204 that are properly aligned. The first overlay mark 202 is a periodic structure such as the periodic structure 108 described above. The second overlay mark 204 is also a periodic structure such as the periodic structure 110 described above.

FIG. 2B illustrates an example in which the overlay marks 202, 204 are misaligned. Specifically, the second overlay mark 204 is spaced further than it should be from the second overlay mark 204. FIG. 2C illustrates an example in which the overlay marks 202, 204 are misaligned. Specifically, the second overlay mark 204 is spaced closer than it should be to the first overlay mark 202.

FIGS. 3A, 3B, and 3C are graphs showing acoustic wave signals corresponding to the placement of the periodic structures of FIGS. 2A, 2B, and 2C. Specifically, FIG. 3A illustrates an acoustic signal corresponding to the positions of the overlay marks 202, 204 as shown in FIG. 2A. FIG. 3B illustrates an acoustic signal corresponding to the positions of the overlay marks 202, 204 as shown in FIG. 2B. FIG. 3C illustrates an acoustic signal corresponding to the positions of the overlay marks 202, 204 as shown in FIG. 2C.

FIG. 3A illustrates a graph with a vertical axis that represents amplitude and a horizontal axis 304 that represents frequency. The signal 308 corresponds to an acoustic signal produced when the overlay marks are spaced as shown in FIG. 2A. The center frequency 306 of such a signal is indicated by the dotted line. FIG. 3B illustrates a signal 310 associated with the overlay marks 202, 204 as they are shown in FIG. 2B. In other words, because the overlay marks are spaced apart further than they should be, the center frequency of signal 310 is offset from (less than) the center frequency 306 of where it should be. Similarly, FIG. 3C illustrates a signal 312 associated with the overlay marks 202, 204 as they are shown in FIG. 2C. In other words, because the overlay marks are spaced closer than they should be, the center frequency of signal 312 is offset from (greater than) the center frequency 306 of where it should be.

FIGS. 4A, 4B, and 4C are graphs showing reflected acoustic wave signals corresponding to the placement of the periodic structures of FIGS. 2A, 2B, and 2C, according to one example of principles described herein. Specifically, FIG. 4A illustrates a reflected acoustic signal corresponding to the positions of the overlay marks 202, 204 as shown in FIG. 2A. FIG. 4B illustrates a reflected acoustic signal corresponding to the positions of the overlay marks 202, 204 as shown in FIG. 2B. FIG. 4C illustrates an acoustic signal corresponding to the positions of the overlay marks 202, 204 as shown in FIG. 2C.

FIG. 4A illustrates a graph with a vertical axis 302 that represents amplitude and a horizontal axis 304 that represents frequency. The signal 402 corresponds to an acoustic signal reflected from the overlay marks 202, 204 when the overlay marks 202, 204 are spaced as shown in FIG. 2A. The center frequency 306 of such a signal is indicated by the dotted line. FIG. 4B illustrates a signal 404 as reflected off of the overlay marks 202, 204 as they are shown in FIG. 2B. In other words, because the overlay marks 202, 204 are spaced apart further than they should be, signal 404 is offset from (less than) the center frequency 306 of the aligned signal 402. Similarly, FIG. 4C illustrates a signal 406 as reflected off of the overlay marks 202, 204 as they are shown in FIG. 2C. In other words, because the overlay marks 202, 204 are spaced closer than they should be, the signal 406 is offset from (greater than) the aligned signal 402.

FIGS. 5A, 5B, and 5C are graphs showing transmitted acoustic wave signals corresponding to the placement of the periodic structures of FIGS. 2A, 2B, and 2C. Specifically, FIG. 5A illustrates a reflected acoustic signal corresponding to the positions of the overlay marks 202, 204 as shown in FIG. 2A. FIG. 5B illustrates a reflected acoustic signal corresponding to the positions of the overlay marks 202, 204 as shown in FIG. 2B. FIG. 5C illustrates an acoustic signal corresponding to the positions of the overlay marks 202, 204 as shown in FIG. 2C.

FIG. 5A illustrates a graph with a vertical axis 302 that represents amplitude and a horizontal axis 304 that represents frequency. The signal 502 corresponds to an acoustic signal after being transmitted through the overlay marks 202, 204 when the overlay marks 202, 204 are spaced as shown in FIG. 2A. The center frequency 306 of such a signal is indicated by the dotted line. FIG. 4B illustrates a signal 504 as transmitted through the overlay marks 202, 204 as they are shown in FIG. 2B. In other words, because the overlay marks 202, 204 are spaced apart further than they should be, signal 504 is offset from (less than) the center frequency 306 of the aligned signal 402. Similarly, FIG. 5C illustrates a signal 506 as reflected off of the overlay marks 202, 204 as they are shown in FIG. 2C. In other words, because the overlay marks 202, 204 are spaced closer than they should be, the signal 506 is offset from (greater than) the aligned signal 402.

Figure 6A:
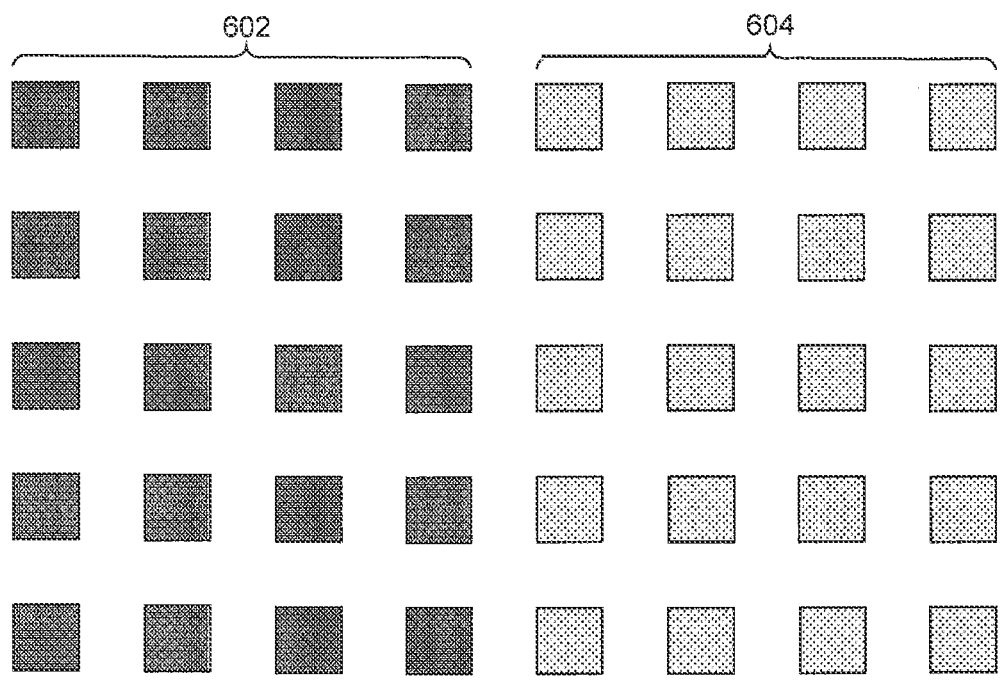
FIGS. 6A and 6B are diagrams showing illustrative feature shapes for overlay marks, according to one example of principles described herein.
Figure 6B:
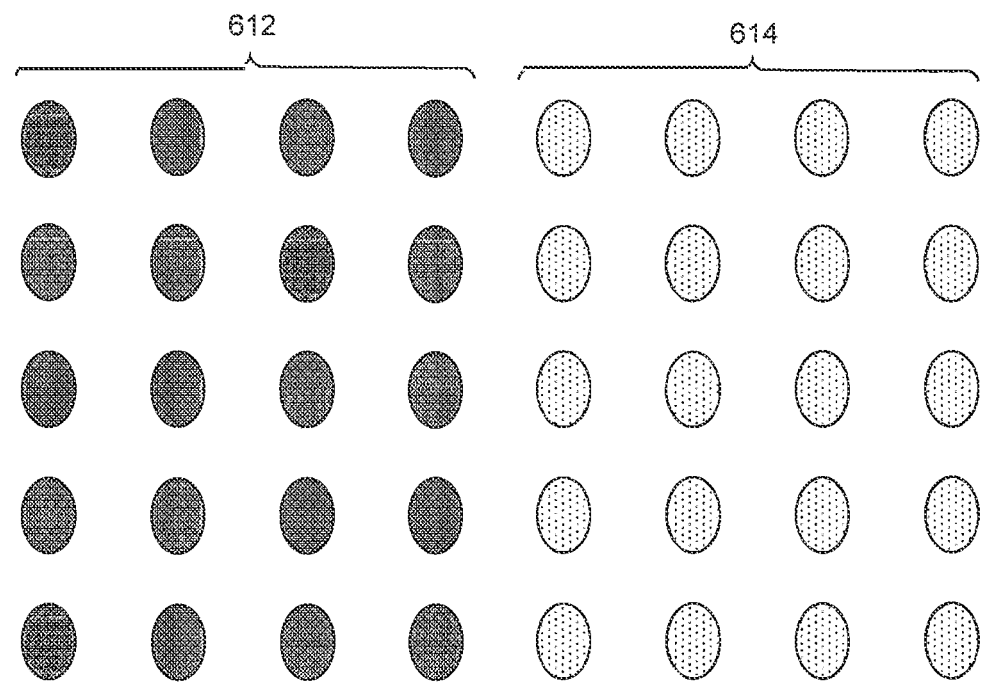

FIGS. 6A and 6B are diagrams showing illustrative feature shapes for overlay marks. According to the present example, FIG. 6A illustrates a first overlay mark 602 having a periodic structure adjacent a second overlay mark 604 having a periodic structure. Both overlay marks 602, 604 are substantially rectangular in shape. More specifically, as illustrated, the overlay marks 602, 604 have a square shape. FIG. 6B illustrates a first overlay mark 612 having a periodic structure adjacent a second overlay mark 614 having a periodic structure. Both overlay marks 612, 614 are substantially elliptical in shape. Other shapes are contemplated as well. For example, the features of the overlay marks described herein may have a circular shape.

Figure 7A:
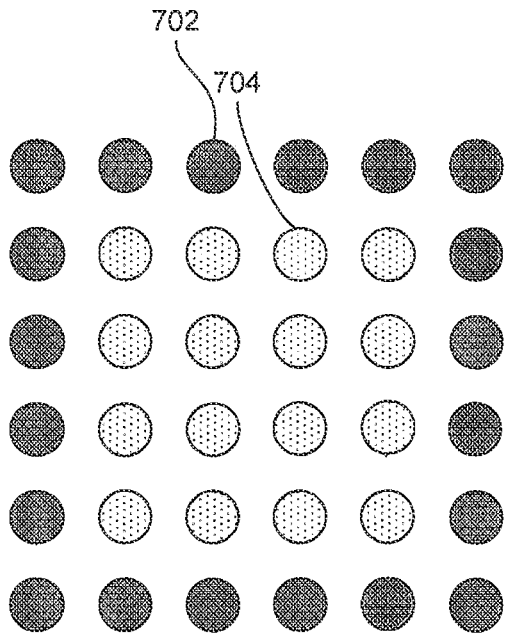

FIGS. 7A, 7B, 7C, 7D, 7E, 7F, and 7G are diagrams showing various configurations for overlay marks. According to the present example, FIG. 7A illustrates a first overlay mark with a set of features 702 that circumscribes, or surrounds features 704 of a second overlay mark. While only a single row of features 702 is shown surrounding the features 704, it is understood that some examples may include several rows of features 702 surrounding features 704. When the features 702 are misaligned from features 704, the characteristics of acoustic waves either being transmitted through or reflected off of the features 702, 704 will indicate the nature of the misalignment.

Figure 7B:
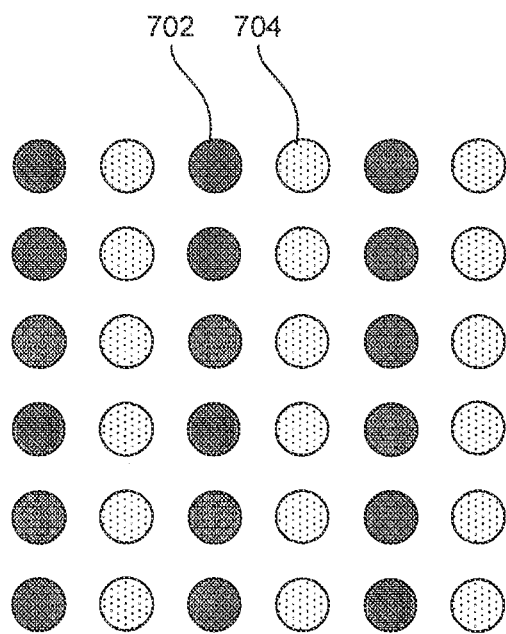

FIG. 7B is a diagram showing an example in which a first overlay mark is intermingled with a second overlay mark. For example, features 702 from the first overlay mark are positioned in rows. Similarly features 704 from the second overlay mark are positioned in rows. The rows of different types of features 702, 704 alternate. When the features 702 are misaligned from features 704, the characteristics of acoustic waves either being transmitted through or reflected off of the features 702, 704 will indicate the nature of the misalignment.

Figure 7C:
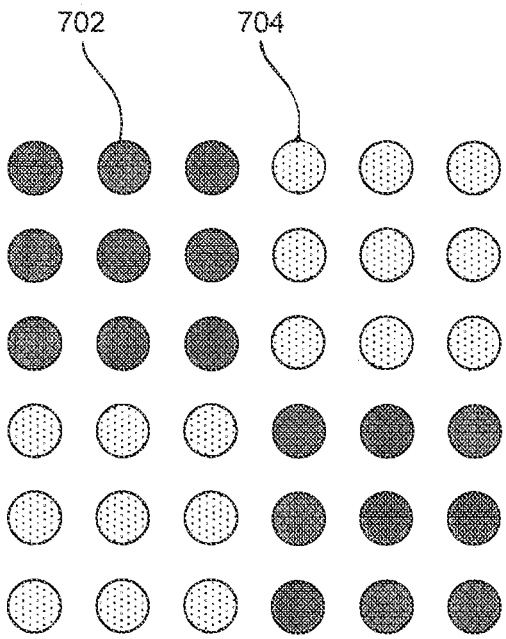

FIG. 7C is a diagram showing an example in which a first overlay mark is intermingled with a second overlay mark. For example, features 702 from the first overlay mark are clustered in the top left and the bottom right. Features 704 from the second overlay mark are clustered at the top right and the bottom left. Such a configuration may also allow for determining alignment in more than one direction. For example, alignment may be determined in one direction, and a second direction orthogonal to the first direction. When the features 702 are misaligned from features 704, the characteristics of acoustic waves either being transmitted through or reflected off of the features 702, 704 will indicate the nature of the misalignment.

Figure 7D:
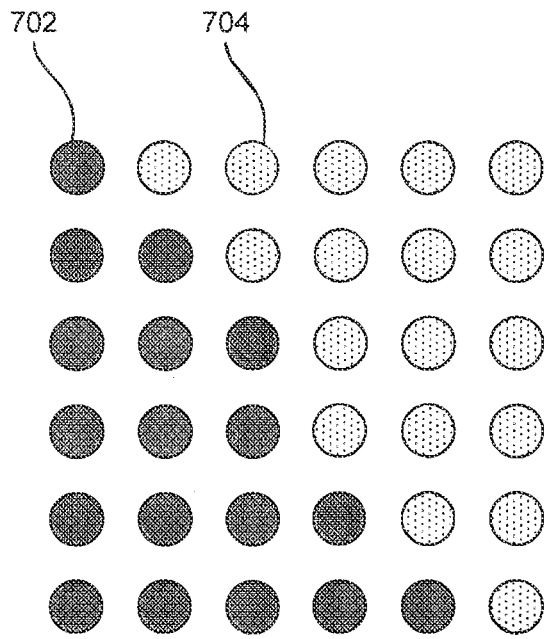

FIG. 7D is a diagram showing an example in which a first overlay mark is adjacent a second overlay mark in a diagonal manner. For example, features 702 from the first overlay mark are positioned at the bottom left. Features 704 from the second overlay mark are positioned at the top right. Such a configuration may also allow for determining alignment in more than one direction. For example, alignment may be determined in one direction, and a second direction orthogonal to the first direction. When the features 702 are misaligned from features 704, the characteristics of acoustic waves either being transmitted through or reflected off of the features 702, 704 will indicate the nature of the misalignment.

FIG. 7E is a diagram showing an example in which a first overlay mark is intermingled with a second overlay mark. For example, features 702 from the first overlay mark are positioned in rows. Similarly features 704 from the second overlay mark are positioned in rows. The rows of different types of features 702, 704 alternate. However, there are more rows of features 704 than there are rows of features 702. When the features 702 are misaligned from features 704, the characteristics of acoustic waves either being transmitted through or reflected off of the features 702, 704 will indicate the nature of the misalignment.

FIG. 7F is a diagram showing an example in which a first overlay mark is intermingled with a second overlay mark. For example, features 702 from the first overlay mark are positioned in rows. Similarly features 704 from the second overlay mark are positioned in rows. The rows of different types of features 702, 704 alternate. However, there are more rows of features 704 than there are rows of features 702. FIG. 7F is similar to FIG. 7E, except the rows run in a different direction. When the features 702 are misaligned from features 704, the characteristics of acoustic waves either being transmitted through or reflected off of the features 702, 704 will indicate the nature of the misalignment.

FIG. 7G is a diagram showing an example in which a first overlay mark is intermingled with a second overlay mark. For example, features 702 from the first overlay mark and features 704 from the second overlay mark are positioned in a checkered pattern. Such a configuration may also allow for determining alignment in more than one direction. For example, alignment may be determined in one direction, and a second direction orthogonal to the first direction. When the features 702 are misaligned from features 704, the characteristics of acoustic waves either being transmitted through or reflected off of the features 702, 704 will indicate the nature of the misalignment.

Figure 8:
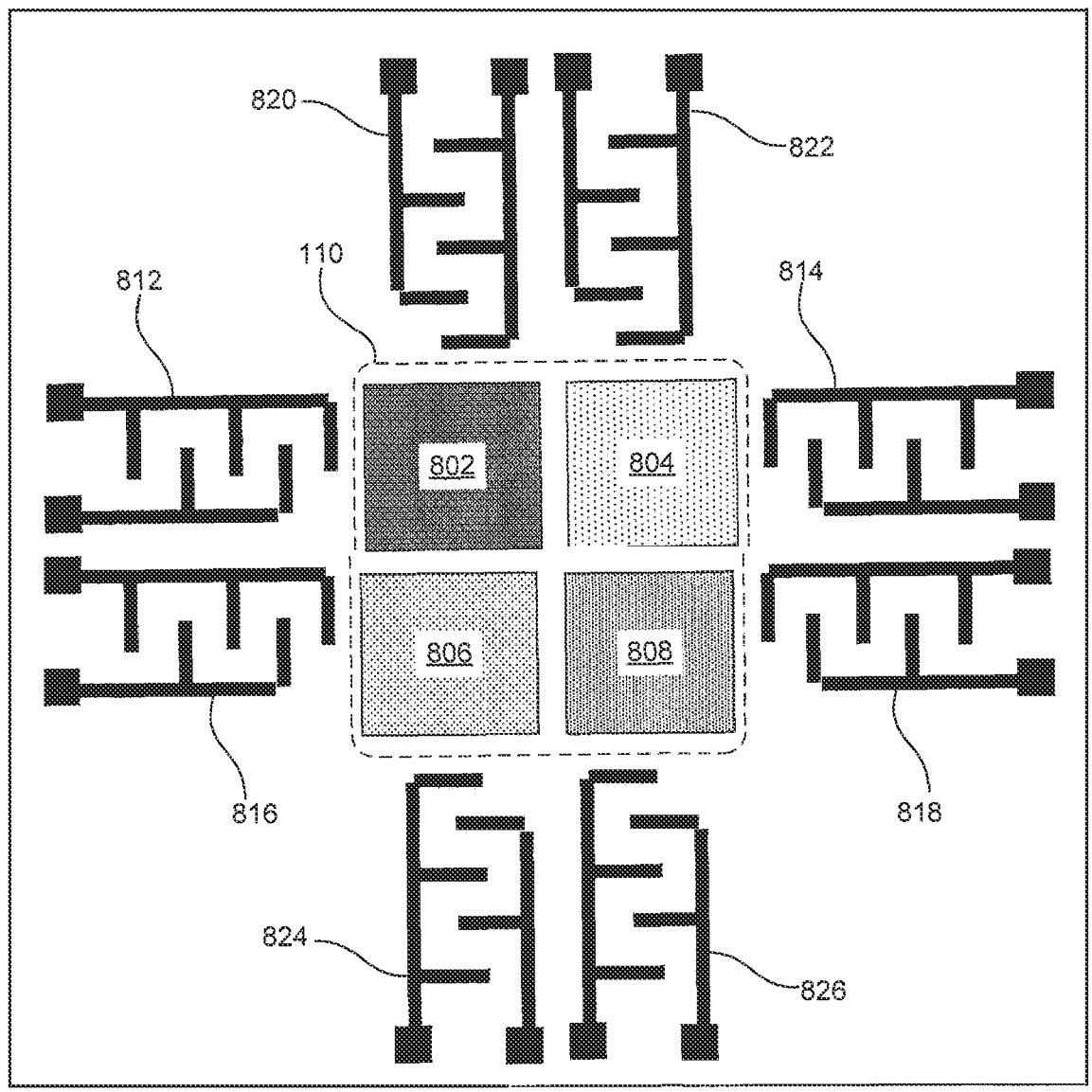
FIG. 8 is a diagram showing various periodic structures, acoustic wave transmitters and acoustic wave receivers, according to one example of principles described herein.

FIG. 8 is a diagram showing various periodic structures, acoustic wave transmitters and acoustic wave receivers. According to the present example, four different overlay marks 802, 804, 806, 808 are positioned in a square pattern within a periodic structure region 110. In some examples, each of the overlay marks may be associated with a different material layer. In some examples, two of the overlay marks may be associated with the same material layer and two of the overlay marks may be associated with a different material layer. The overlay marks 802, 804, 806, 808 may each comprise periodic structures having a plurality of features in a periodic pattern, such as the patterns described above.

Figure 9:
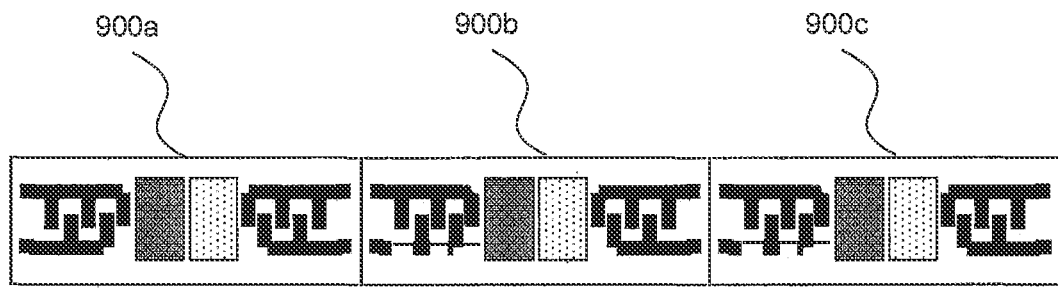
FIG. 9 is a diagram showing multiple overlay mark regions in series, according to one example of principles described herein.

In one example, device 812 is an acoustic wave transmitter device configured to transmit an acoustic wave across overlay marks 802, 804. Such acoustic wave may be picked up by device 814. Similarly, device 816 may be an acoustic wave transmitter device configured to transmit an acoustic wave across overlay marks 806, 808. Such acoustic wave may be picked up by device 818. Furthermore, device 820 may be an acoustic wave transmitter device configured to transmit an acoustic wave across overlay marks 802, 806. Such acoustic wave may be picked up by device 824. Similarly, device 822 may be an acoustic wave transmitter device configured to transmit an acoustic wave across overlay marks 804, 808. Such acoustic wave may be picked up by device 826. Thus, the configuration shown in FIG. 8 may be used to detect FIG. 9 is a diagram showing multiple overlay mark regions in series. According to the present example, a plurality of overlay regions 900a, 900b, 900c are positioned in series. In other words, they are positioned along a line that runs in the direction in which acoustic waves are transmitted throughout the overlay regions 900a, 900b, 900c. Each overlay region 900a, 900b, 900c includes an acoustic wave transmitter device, an acoustic wave receiver device, and at least two overlay marks comprising periodic structures.

Figure 10:
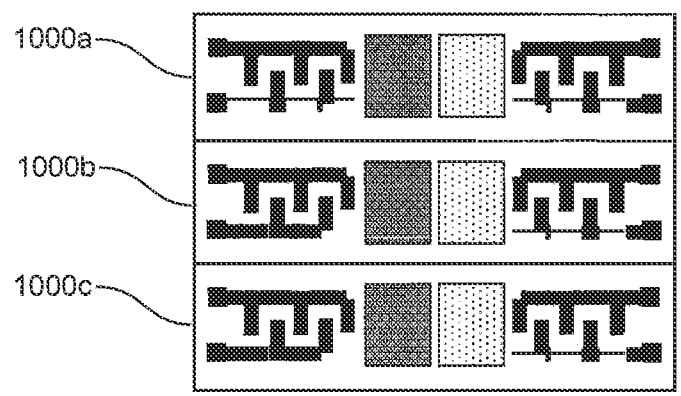
FIG. 10 is a diagram showing multiple overlap mark regions in parallel, according to one example of principles described herein.

FIG. 10 is a diagram showing multiple overlap mark regions in parallel. According to the present example, a plurality of overlay regions 1000a, 1000b, 1000c are positioned in parallel. In other words, they are positioned along a line that runs orthogonal to the direction in which acoustic waves are transmitted throughout the overlay regions 1000a, 1000b, 1000c. Each overlay region 1000a, 1000b, 1000c includes an acoustic wave transmitter device, an acoustic wave receiver device, and at least two overlay marks comprising periodic structures.

Figure 11A:
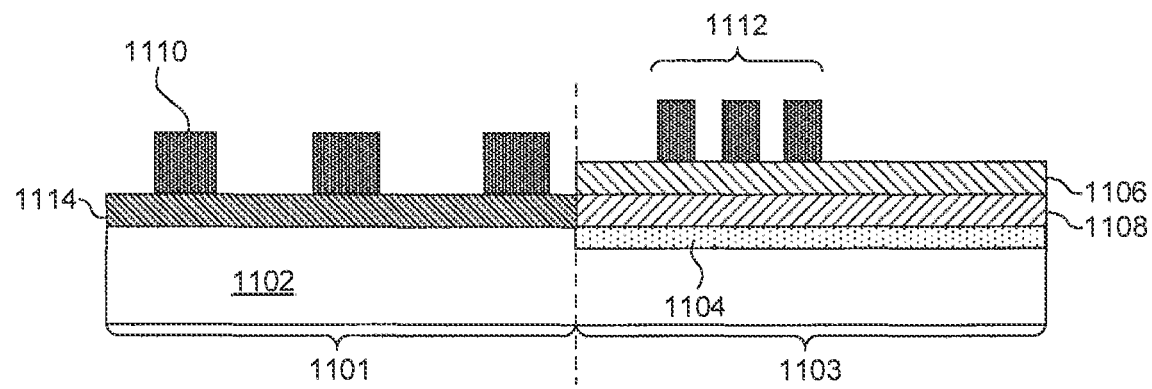
FIGS. 11A to 11D are diagrams showing illustrative formation of overlay marks, according to one example of principles described herein.

FIGS. 11A to 11D are diagrams showing illustrative formation of overlay marks. According to the present example, FIG. 11A illustrates two different sections of a fabrication wafer 1102. The first section is a production section 1101 and the second section is a test section 1103. The production section 1101 is a portion of the wafer on which integrated circuits are fabricated. The test section 1103 is a portion of the wafer in which overlay marks may be formed to test the alignment of patterns of different layers formed in the production section 1101. For purposes of the present discussion, test section 1103 may correspond to the periodic structure region 112 described above in the text accompanying FIG. 1.

According to the present example, the test section 1103 includes a piece electrically 1104, a first hard mask layer 1108, and a second hard mask layer 1106. As described above, overlay marks may be positioned over a piezoelectric layer. A piezoelectric material may experience mechanical strain or stress upon application of an electrical current. Thus, an AC electrical signal applied to the acoustic wave transmitter device may cause surface acoustic wave signal to be transmitted across the test section 1103.

At the same time, the production section 1101 may have a first material layer 1114 to be patterned. The first material layer 1114 may be one of a variety of materials. For example, the first material layer 1114 may be of polysilicon layer to form gate structures, or a metal layer to form interconnects. After the first material layer 1114 has been deposited, a first patterned photoresist layer is deposited, exposed to a light source through a mask, and developed. After development, photoresist features 1110 remain in the production section 1101, and photoresist features 1112 remain in the test section. Photoresist features 1112 may correspond to a first overlay mark that includes plurality of periodic structures.

Figure 11B:
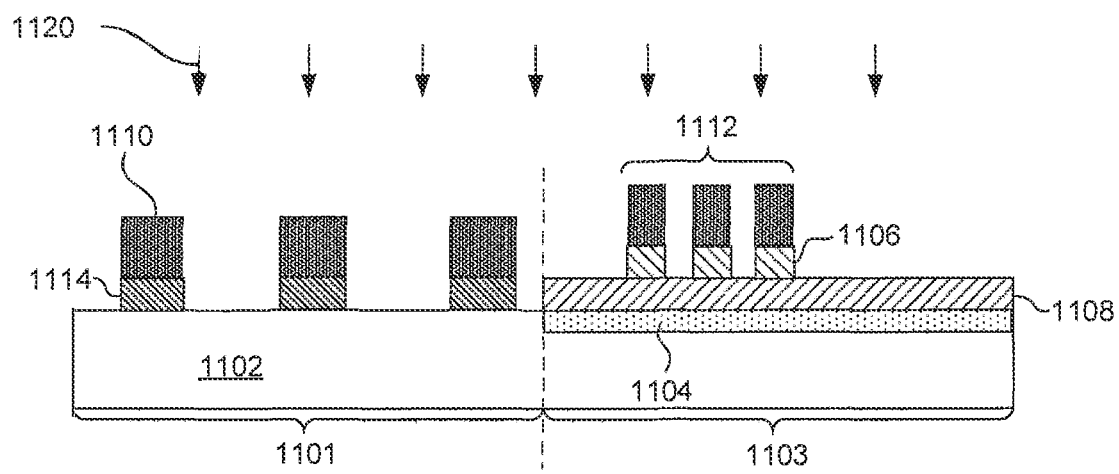

FIG. 11B illustrates an etching process 1120 to pattern both the second hard mask 1106 in the test section 1103 and the first material layer 1114 in the production section 1101. The hard mask 1106 may be selected to have a material that is removable in the same etching process used to pattern the first material layer 1114 in the production section. After the etching process, the photoresist features 1110, 1112 may be removed.

Figure 11C:
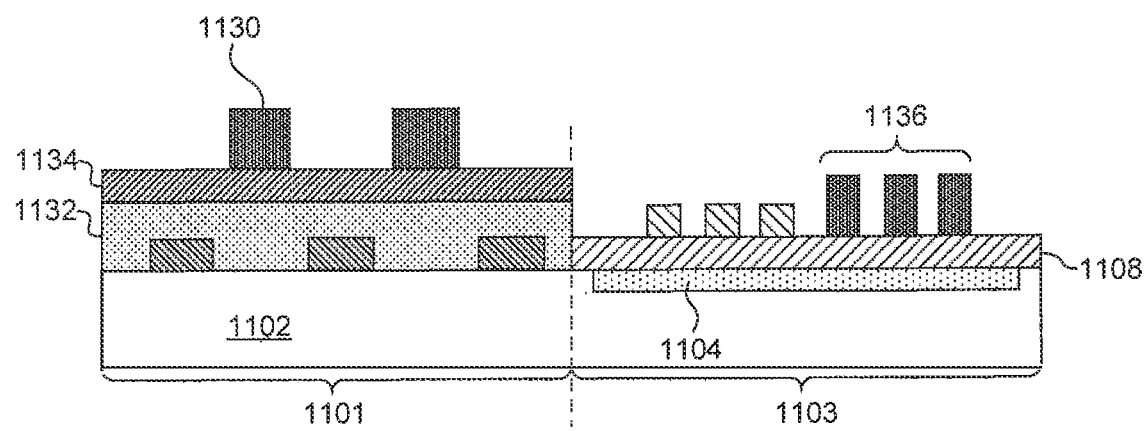

FIG. 11C illustrates additional layers. Specifically, FIG. 11C illustrates an interlayer dielectric layer 1132 deposited over the first material layer features in the production section 1101. The production section 1101 also includes a second material layer 1134 deposited over the interlayer dielectric layer 1132. The second material 1134 may be one of a variety of materials. For example, the second material layer 1134 may be a metal material to form metal lines or vias.

A second photoresist layer is then deposited. The second photoresist layer, after being exposed and developed, includes photoresist features 1130 in the production section and photoresist features 1136 in the rest section. The photoresist features 1136 correspond to a second overlay mark structure that includes a plurality of periodic features. The first photoresist features 1130 and second photoresist features 1136 are formed using the same mask. That mask is designed such that when the first photoresist features 1130 are aligned with the features of the first material layer 1114, the photoresist features 1136 are positioned such that they form a unitary overlay mark with the features of the second hard mask 1106 (e.g., as shown in FIG. 2A). In other words, all features of both the first hard mask features 1106 and the second photoresist features 1136 will have similar spacing. This creates the desired frequency signals in the detected acoustic waves passing through the features. If the first photoresist features 1130 are not properly aligned with the first material layer (e.g., as shown in FIGS. 2B and 2C), then the photoresist features 1136 will not be spaced properly with respect to the features of the second hard mask 1106.

Figure 11D:
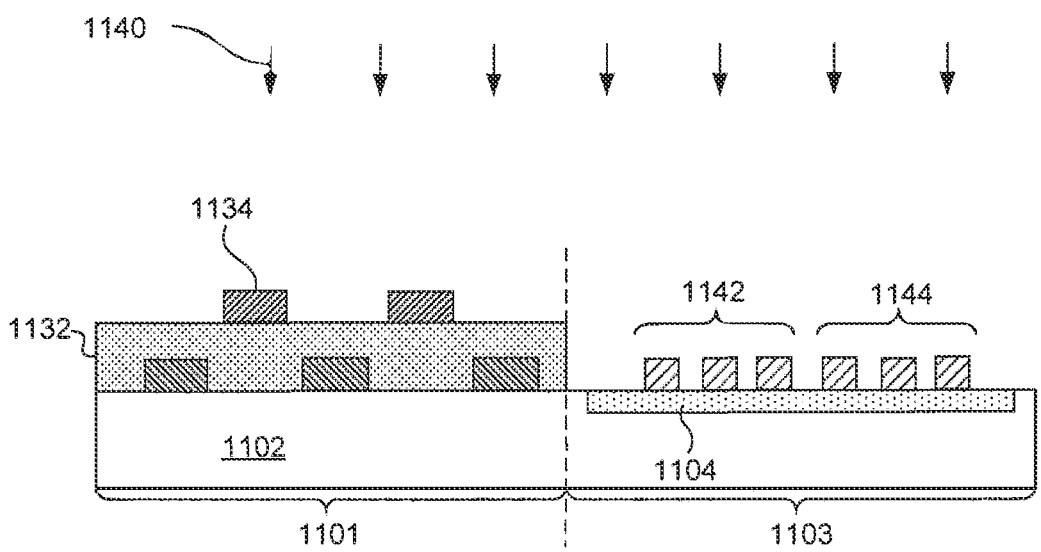

FIG. 11D illustrates an etching process 1140. After the photoresist features 1130, 1136 are formed, an etching process may be applied to pattern the second material layer 1134 and the first hard mask layer 1108. The features of the second hard mask layer 1106 and the photoresist features 1136 define the pattern that will be transferred to the first hard mask 1108. In some examples, the etching process 1140 may be selected along with the materials of the first hard mask 1108 and the second material layer 1134 so that both the first hard mask 1108 and the second material layer 1134 are removed by the same etching process.

FIG. 11D illustrates a state after the etching process 1140 and after the photoresist features and second hard mask features have been removed. After such features have been removed, the remaining features 1142, 1144 of the first hard mask layer 1108 remain. Features 1142 may correspond to a first overlay mark (e.g., 108, FIG. 1) and the features 1144 may correspond to a second overlay mark (e.g., 110, FIG. 1). After the features 1142, 1144 are formed, acoustic signals may be transmitted across the features 1142, 1144 to determine whether the features 1134 are properly aligned with the features of the first material layer 1114.

Figure 12:
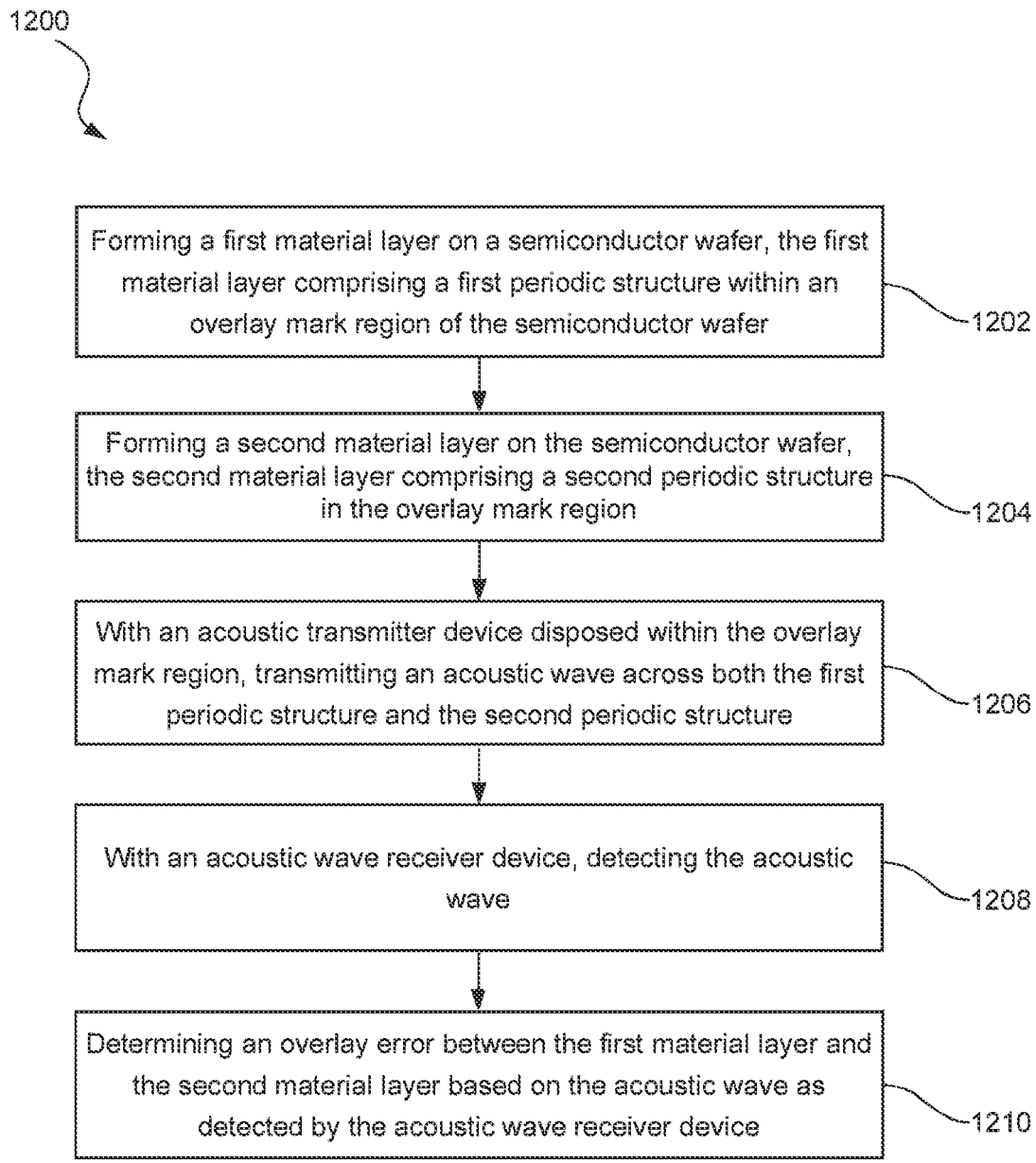
FIG. 12 is a flowchart showing an illustrative method for using acoustic waves to detect overlay error, according to one example of principles described herein.

FIG. 12 is a flowchart showing an illustrative method for using acoustic waves to detect overlay error. According to the present example, the method 1200 includes a process 1202 for forming a first material layer on a semiconductor wafer, the first material layer comprising a first periodic structure within an overlay mark region of the semiconductor wafer. According to the present example, the method 1200 includes a process 1204 for forming a second material layer on the semiconductor wafer, the second material layer comprising a second periodic structure in the overlay mark region. According to the present example, the method 1200 includes a process 1206 for, with an acoustic transmitter device disposed within the overlay mark region, transmitting an acoustic wave across both the first periodic structure and the second periodic structure. According to the present example, the method 1200 includes a process 1208 for, with an acoustic wave receiver device, detecting the acoustic wave. According to the present example, the method 1200 includes a process 1210 for determining an overlay error between the first material layer and the second material layer based on the acoustic wave as detected by the acoustic wave receiver device.

According to one example, a structure includes a first periodic structure positioned on a chip, the first periodic structure comprising a material of a first layer disposed on the chip. The structure further includes a second periodic structure positioned within the region of the chip adjacent the first periodic structure, the second periodic structure comprising a second material of a second layer disposed on the chip. The structure further includes an acoustic wave transmitter device disposed on the chip and an acoustic wave receiver device disposed on the chip.

According to one example, a device includes an acoustic wave transmitter positioned on a chip, an acoustic wave receiver positioned on the chip, and a first periodic structure positioned on the chip, the first periodic structure comprising a first material. The device further includes a second periodic structure positioned on the chip, the second periodic structure comprising a second material.

According to one example, a method includes forming a first material layer on a semiconductor wafer, the first material layer comprising a first periodic structure within an overlay mark region of the semiconductor wafer. The method further includes forming a second material layer on the semiconductor wafer, the second material layer comprising a second periodic structure in the overlay mark region. The method further includes, with an acoustic transmitter device disposed within the overlay mark region, transmitting an acoustic wave across both the first periodic structure and the second periodic structure. The method further includes, with an acoustic wave receiver device, detecting the acoustic wave. The method further includes determining an overlay error between the first material layer and the second material layer based on the acoustic wave as detected by the acoustic wave receiver device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first material layer on a semiconductor wafer, the first material layer comprising a first periodic structure within an overlay mark region of the semiconductor wafer;
    forming a second material layer on the semiconductor wafer, the second material layer comprising a second periodic structure in the overlay mark region;
    with an acoustic transmitter device disposed within the overlay mark region, transmitting an acoustic wave across both the first periodic structure and the second periodic structure;
    with an acoustic wave receiver device, detecting the acoustic wave; and
    determining an overlay error between the first material layer and the second material layer based on the acoustic wave as detected by the acoustic wave receiver device.

2. The method of claim 1, wherein the acoustic wave detected by the acoustic wave receiver device is one of: a transmission through the periodic structures or a reflectance off of the periodic structures.

3. The method of claim 1, wherein determining the overlay error comprises analyzing the detected acoustic wave using one of: scattering frequency count; scattering angle; full width half maximum, or center frequency.

4. The method of claim 1, wherein determining the overlay error comprises determining an error in a first direction and a second direction orthogonal to the first direction.

5. The method of claim 1, further comprising, determining a focus curve by analyzing the detected acoustic wave.

6. A method for forming a structure, the method comprising:
  forming a first periodic structure on a chip, the first periodic structure comprising a material of a first layer disposed on the chip, wherein the first periodic structure comprises a two-dimensional array of features;
  forming a second periodic structure within a region of the chip adjacent the first periodic structure, the second periodic structure comprising a second material of a second layer disposed on the chip;
  forming an acoustic wave transmitter device on the chip; and
  forming an acoustic wave receiver device on the chip.

7. The structure of claim 6, wherein the first period structure and the second periodic structure are positioned between the acoustic wave transmitter device and the acoustic wave receiver device.

8. The method of claim 6, further comprising:
  with the acoustic wave transmitter device, transmitting an acoustic wave across both the first periodic structure and the second periodic structure;
  with the acoustic wave receiver device, detecting the acoustic wave; and
  determining an overlay error between the first material layer and the second material layer based on the acoustic wave as detected by the acoustic wave receiver device.

9. The method of claim 6, wherein features within the array of features have one of: a rectangular shape, an elliptical shape, a circular shape, or a square shape.

10. The method of claim 6, wherein features of the first periodic structure are intermingled with features of the second periodic structure.

11. The method of claim 10, wherein the features of the first periodic structure and the features of the second periodic structure are positioned in alternating rows.

12. The method of claim 10, wherein the features of the first periodic structure and the features of the second periodic structure are positioned in a checkered pattern.

13. The method of claim 6, wherein features of the first periodic structure circumscribe features of the second periodic structure.

14. The method of claim 6, further comprising, a piezoelectric layer underneath the first periodic structure and the second periodic structure.

15. The method of claim 6, further comprising, regions of the chip, each region comprising additional periodic structures, an additional acoustic wave receiver, and an additional acoustic wave transmitter, the regions being positioned in series.

16. The method of claim 6, further comprising, regions of the chip, each region comprising additional periodic structures, an additional acoustic wave receiver, and an additional acoustic wave transmitter, the regions being positioned in parallel.

17. A method comprising:
  forming an acoustic wave transmitter on a chip;
  forming an acoustic wave receiver on the chip;
  forming a first periodic structure on the chip, the first periodic structure comprising a first material; and
  forming a second periodic structure on the chip, the second periodic structure comprising a second material;
  wherein the acoustic wave transmitter device is configured to transmit an acoustic wave across both the first periodic structure and the second periodic structure.

18. The method of claim 17, wherein the acoustic wave transmitter comprises an interdigital transducer.

19. The method of claim 17, wherein the acoustic wave transmitter comprises an acoustic emitter.

20. The method of claim 17, further comprising:
  with the acoustic wave transmitter, transmitting an acoustic wave across both the first periodic structure and the second periodic structure;
  with the acoustic wave receiver, detecting the acoustic wave; and
  determining an overlay error between the first material layer and the second material layer based on the acoustic wave as detected by the acoustic wave receiver.

* * * * *